(12) United States Patent
Lee et al.

(10) Patent No.: US 9,246,120 B2
(45) Date of Patent: Jan. 26, 2016

(54) FUNCTIONAL LAYER FOR ORGANIC LIGHT-EMITTING DIODE, ORGANIC LIGHT-EMITTING DISPLAY APPARATUS INCLUDING THE SAME, AND METHOD OF MANUFACTURING THE ORGANIC LIGHT-EMITTING DIODE

(71) Applicant: SAMSUNG DISPLAY CO., LTD., Yongin, Gyeonggi-Do (KR)

(72) Inventors: Ji-Hwang Lee, Yongin (KR); Eui-Gyu Kim, Yongin (KR); A-Rong Lee, Yongin (KR); Yool-Guk Kim, Yongin (KR); Seok-Soon Back, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/079,429

(22) Filed: Nov. 13, 2013

(65) Prior Publication Data

US 2015/0021558 A1 Jan. 22, 2015

(30) Foreign Application Priority Data

Jul. 22, 2013 (KR) .................. 10-2013-0086272

(51) Int. Cl.
*H01L 51/50* (2006.01)
*H01L 51/52* (2006.01)
*H01L 51/54* (2006.01)
*H01L 51/56* (2006.01)

(52) U.S. Cl.
CPC ........ *H01L 51/5076* (2013.01); *H01L 51/5008* (2013.01); *H01L 51/5072* (2013.01); *H01L 51/5092* (2013.01); *H01L 2251/5346* (2013.01); *H01L 2251/5369* (2013.01)

(58) Field of Classification Search
CPC .................................... H01L 51/5072–51/5092
USPC ............................................. 257/40; 438/37
See application file for complete search history.

(56) References Cited

U.S. PATENT DOCUMENTS

| 2006/0180200 | A1* | 8/2006 | Platzer Bjorkman et al. | 136/265 |
| 2011/0284825 | A1 | 11/2011 | Yang et al. | |
| 2011/0297216 | A1 | 12/2011 | Ihn et al. | |
| 2012/0001184 | A1* | 1/2012 | Ha et al. | 257/59 |
| 2012/0138894 | A1* | 6/2012 | Qian et al. | 257/13 |
| 2013/0009131 | A1* | 1/2013 | Kazlas et al. | 257/13 |

FOREIGN PATENT DOCUMENTS

| JP | 2009-230967 | 10/2009 |
| JP | 2012-004287 | 1/2012 |
| KR | 10-2011-0085480 | 7/2011 |
| KR | 10-2011-0128605 | 11/2011 |
| KR | 10-2011-0133717 | 12/2011 |
| WO | WO 2011/158899 A1 | 12/2011 |

\* cited by examiner

*Primary Examiner* — Thao X Le
*Assistant Examiner* — J.R. Oakley
(74) *Attorney, Agent, or Firm* — Christie, Parker & Hale, LLP

(57) ABSTRACT

An organic light-emitting diode includes a first electrode, an intermediate layer on the first electrode, and a second electrode on the intermediate layer. The intermediate layer includes an emission layer including an organic material, and a functional layer between the second electrode and the emission layer and including at least one of a metal compound and a semiconductor compound including at least one of an oxygen atom and a sulfur atom. An oxygen concentration in the functional layer increases toward the second electrode, and a sulfur concentration in the functional layer increases toward the emission layer.

18 Claims, 4 Drawing Sheets

FUNCTIONAL LAYER FOR ORGANIC LIGHT-EMITTING DIODE, ORGANIC LIGHT-EMITTING DISPLAY APPARATUS INCLUDING THE SAME, AND METHOD OF MANUFACTURING THE ORGANIC LIGHT-EMITTING DIODE

CROSS-REFERENCE TO RELATED APPLICATION

This application claims priority to and the benefit of Korean Patent Application No. 10-2013-0086272, filed on Jul. 22, 2013, in the Korean Intellectual Property Office, the content of which is incorporated herein in its entirety by reference.

BACKGROUND

1. Field

One or more embodiments of the present invention relate to an organic light-emitting diode having improved light-emitting efficiency, an organic light-emitting display apparatus including the same, and a method of manufacturing the organic light-emitting diode.

2. Description of the Related Art

An organic light-emitting diode (OLED) has a stacked structure including a first electrode, an intermediate layer, and a second electrode. The intermediate layer includes an emission layer including an organic material and a plurality of functional layers. The functional layers include various suitable materials to increase the light-emitting efficiency of the OLED.

Among the functional layers, an electron injection layer or an electron injection transport layer disposed between the second electrode and an emission layer are important for improving the properties of the OLED. Thus, the light-emitting efficiency of the OLED may be improved with increasing the electron injection function of the electron injection layer or the electron injection transport layer.

SUMMARY

Aspects of one or more embodiments of the present invention are directed toward an organic light-emitting diode having improved light-emitting efficiency, an organic light-emitting display apparatus including the same, and a method of manufacturing the organic light-emitting diode. However, the scope of the present invention is not limited thereto.

Additional aspects will be set forth in part in the description which follows and, in part, will be apparent from the description, or may be learned by practice of the presented embodiments.

According to one or more embodiments of the present invention, an organic light-emitting diode includes a first electrode, an intermediate layer on the first electrode, and a second electrode on the intermediate layer. The intermediate layer includes an emission layer including an organic material, and a functional layer between the second electrode and the emission layer and including at least one of a metal compound and a semiconductor compound, the at least one of the metal compound and the semiconductor compound including at least one of an oxygen atom and a sulfur atom. The functional layer may have an increasing oxygen concentration toward the second electrode, or an increasing sulfur concentration toward the emission layer. An oxygen concentration in the functional layer may increase (gradually or smoothly) toward the second electrode, and a sulfur concentration in the functional layer may increase (gradually or smoothly) toward the emission layer. The functional layer may have a concentration gradient with more oxygen concentration toward the second electrode and less oxygen concentration toward the emission layer; or a concentration gradient with more sulfur concentration toward the emission layer and less sulfur concentration toward the second electrode. The at least one of the metal compound and the semiconductor compound may include both the oxygen atom and the sulfur atom, the functional layer having both the increasing oxygen concentration toward the second electrode, and the increasing sulfur concentration toward the emission layer.

The functional layer may be an electron injection layer or an electron injection transport layer.

The functional layer may include $ZnS_xO_{(1-x)}$ (x is a real number satisfying the condition $0<x<1$). X may decrease (e.g., gradually) from 0.5 toward the second electrode, and may increase (e.g., gradually) from 0.5 toward the emission layer.

The functional layer may include nano particles of the at least one of the metal compound and the semiconductor compound. A concentration of the nano particles including the oxygen atom may increase toward the second electrode, and a concentration of the nano particles including the sulfur atom may increase toward the emission layer.

According to one or more embodiments of the present invention, an organic light-emitting display apparatus includes a substrate; a thin film transistor array on the substrate; an insulating layer covering the thin film transistor array; an organic light-emitting diode on the insulating layer and including a first electrode, an intermediate layer on the first electrode, and a second electrode on the intermediate layer, and an encapsulating layer on the substrate for encapsulating the organic light-emitting diode. The intermediate layer includes an emission layer including an organic material, and a functional layer between the second electrode and the emission layer and including at least one of a metal compound and a semiconductor compound, the at least one of the metal compound and the semiconductor compound including at least one of an oxygen atom and a sulfur atom. The functional layer may have an increasing oxygen concentration toward the second electrode, or an increasing sulfur concentration toward the emission layer.

According to one or more embodiments of the present invention, a method of manufacturing an organic light-emitting diode includes forming a first electrode, forming an intermediate layer on the first electrode, and forming a second electrode on the intermediate layer. The forming of the intermediate layer includes forming an emission layer including an organic material, and forming a functional layer between the second electrode and the emission layer, the functional layer including at least one of a metal compound and a semiconductor compound, the at least one of the metal compound and the semiconductor compound including at least one of an oxygen atom and a sulfur atom. The functional layer may have an increasing oxygen concentration toward the second electrode, or an increasing sulfur concentration toward the emission layer.

The forming of the functional layer may include forming a preliminary layer including the at least one of the metal compound and the semiconductor compound on the emission layer via a chemical vapor deposition method or an atomic layer deposition method, and treating a surface of the preliminary layer facing the second electrode with ultraviolet-ozone.

In the forming of the functional layer, a concentration of the oxygen atom and the sulfur atom in the metal compound and the semiconductor compound including the at least one of the oxygen atom and the sulfur atom may be time-controlled via a chemical vapor deposition method or an atomic layer deposition method.

The method may further include treating a surface of the functional layer facing the second electrode with ultraviolet-ozone.

The functional layer may include nano particles of the at least one of the metal compound and the semiconductor compound. The functional layer may be formed by a solution coating method, and a concentration of the nano particles including the oxygen atom in the functional layer may increase (e.g., gradually) toward the second electrode, or a concentration of the nano particles including the sulfur atom in the functional layer may increase (e.g., gradually) toward the emission layer.

According to an example embodiment of the present invention, an organic light-emitting diode having improved light-emitting efficiency, an organic light-emitting display apparatus including the same, and a method of manufacturing the light-emitting diode are provided and the scope of the present invention is not limited to the effects thereof.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
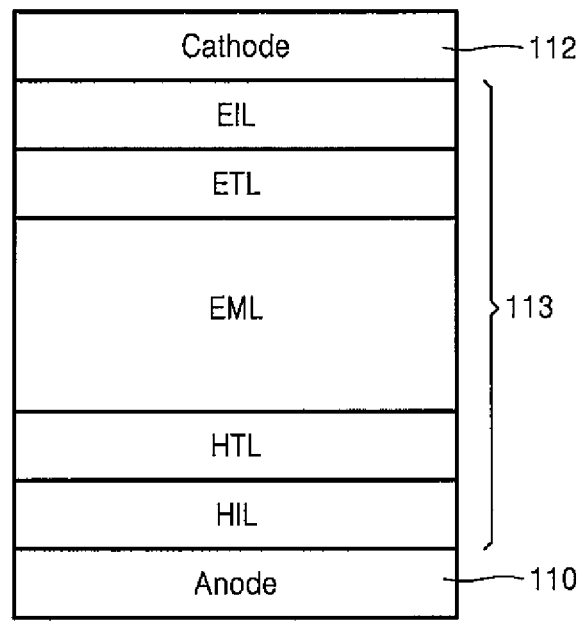
FIG. 1 is a schematic diagram illustrating an organic light-emitting diode according to an example embodiment of the present invention.

Reference will now be made in more detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects of the present description. Expressions such as "at least one of," when preceding a list of elements, modify the entire list of elements and do not modify the individual elements of the list. Further, the use of "may" when describing embodiments of the present invention refers to "one or more embodiments of the present invention."

Hereinafter, example embodiments of the present invention will be explained in more detail. When referring to the drawings, the same or corresponding elements will be given the same reference symbols, and a repeated explanation thereof will not be repeated.

As used herein, the singular forms "a," "an", and "the" are intended to include the plural forms as well, unless the context clearly indicates otherwise. It will be further understood that the terms "comprises" and/or "comprising," when used in this specification, specify the presence of the stated features, elements, and/or components, but do not preclude the presence or addition of one or more other features, elements, and/or components. It will be understood that when a layer, a region or an element is referred to as being "on" another layer, region, or element, it can be directly on the other layer, region or element, or intervening layer, region or elements may be present.

For convenience of explanation, the size of elements in the drawings may be exaggerated or reduced. For example, the size and the thickness of each element in the drawings are randomly chosen, and the present invention is not limited thereto.

FIG. 1 is a schematic diagram illustrating an organic light-emitting diode according to an example embodiment of the present invention.

Referring to FIG. 1, an organic light-emitting diode (OLED) includes a first electrode 110 (an anode), an intermediate layer 113 provided on the first electrode 110, and a second electrode 112 (a cathode) provided on the intermediate layer. In FIG. 1, the first electrode is the anode for injecting holes, and the second electrode is the cathode for injecting electrons. The intermediate layer has a stacked structure including a hole injection layer (HIL), a hole transport layer (HTL), an emission layer (EML), an electron transport layer (ETL), and an electron injection layer (EIL) sequentially stacked from the first electrode.

Even though not illustrated in FIG. 1, a substrate may be additionally provided under the first electrode or on the second electrode. When the substrate is provided on the second electrode, the OLED in FIG. 1 may be an inverted OLED.

When the substrate is provided under the first electrode, the first electrode may be formed by providing a first electrode material on the substrate by a deposition method or a sputtering method. The first electrode material may be selected from suitable materials having a high work function for easy injection of the holes.

The first electrode may be a reflection electrode, a semitransparent electrode, or a transparent electrode. When the substrate is provided under the first electrode and the first electrode is a reflection electrode, the OLED in FIG. 1 may be a top emission OLED. When the substrate is provided under the first electrode and the first electrode is a semitransparent electrode or a transparent electrode, the OLED in FIG. 1 may be a bottom emission or a dual emission OLED.

The first electrode material may include a transparent material having good conductivity such as indium tin oxide (ITO), indium zinc oxide (IZO), tin oxide ($SnO_2$), zinc oxide (ZnO), or the like. As the first electrode material, a metal such as magnesium (Mg), aluminum (Al), aluminum-lithium (Al—Li), calcium (Ca), magnesium-indium (Mg—In), magnesium-silver (Mg—Ag), or the like may be used, but the present invention is not thereby limited.

The first electrode may have a single layer structure or a multi-layer structure. For example, the first electrode may have a three-layer structure of ITO/Ag/ITO, however, the present invention is not limited thereto.

A second electrode facing the first electrode is formed. A metal, an alloy, an electroconductive compound, or a combination thereof having a low work function may be used as a second electrode material. For example, the second electrode material may include lithium (Li), magnesium (Mg), aluminum (Al), aluminum-lithium (Al—Li), calcium (Ca), magnesium-indium (Mg—In), magnesium-silver (Mg—Ag), or the like, but the present invention is not thereby limited. For example, in order to manufacture a top emission OLED, a transmission second electrode may be formed of ITO or IZO, and various suitable other modifications may also be possible.

The EML is provided between the first electrode and the second electrode, and the HIL and the HTL are provided between the first electrode and the EML. The ETL and the EIL are sequentially provided between the EML and the second electrode.

In the OLED in FIG. 1, holes are injected through the first electrode and migrate to the EML via the HIL and the HTL, and electrons are injected through the second electrode and migrate to the EML via the EIL and the ETL. The holes and the electrons that reach the EML may recombine to generate excitons whose state is then changed from an excited state to a ground state while the excitons disappear and light is generated.

The HIL may be formed on the first electrode by using various suitable methods such as a vacuum deposition method, a spin coating method, a cast method, a Langmuir-Blodgett (LB) method, or the like.

When the vacuum deposition method is used to form the HIL, deposition conditions may be determined according to the compound used as the material of the HIL, the structure of the target HIL, the thermal properties of the HIL, or the like. For example, a deposition temperature of from about 100° C. to about 500° C., a vacuum degree of from about $10^{-8}$ torr to about $10^{-3}$ torr, a deposition rate of from about 0.01 Å/sec to about 100 Å/sec, or the like may be selected, but the present invention is not thereby limited.

When the spin coating method is used to form the HIL, coating conditions may be determined according to the compound used as the material of the HIL, the structure of the target HIL, the thermal properties of the HIL, or the like. For example, a coating rate of from about 2,000 rpm to about 5,000 rpm, and a heat treating temperature for removing solvents after coating of from about 80° C. to about 200° C. may be selected, but the present invention is not thereby limited.

As a suitable material for forming the HIL, for example, N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4"-tris(3-methylphenylphenylamino)triphenylamine (m-MTDATA), N,N'-di(1-naphthyl)-N,N'-diphenylbenzidine (NPB), TDATA, 2-TNATA, polyaniline/dodecylbenzenesulfonic acid (Pani/DBSA), poly(3,4-ethylenedioxythiophene)/poly (4-styrenesulfonate) (PEDOT/PSS), polyaniline/camphor sulfinic acid (Pani/CSA), polyanilineypoly(4-styrene-sulfonate (PANI/PSS), or the like may be used, but the present invention is not thereby limited.

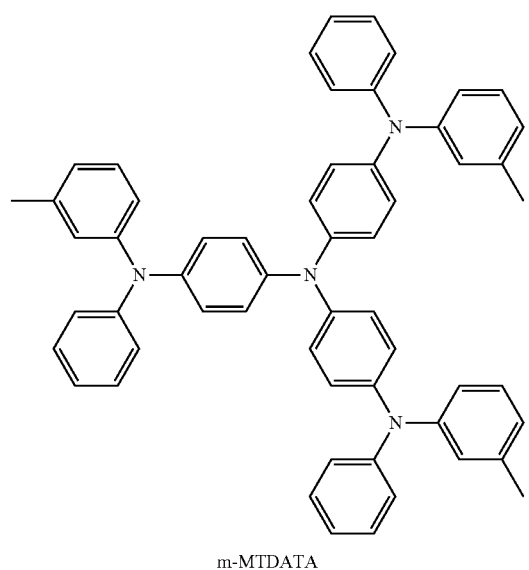

m-MTDATA

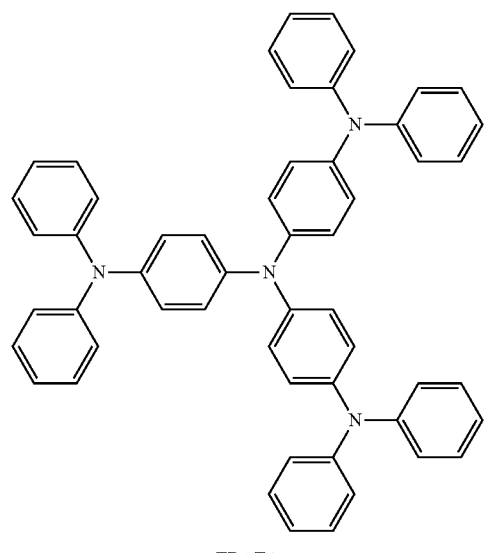

TDATA

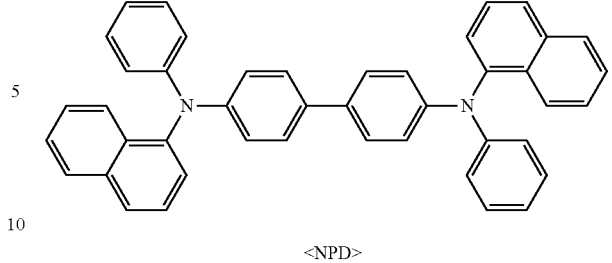

<NPD>

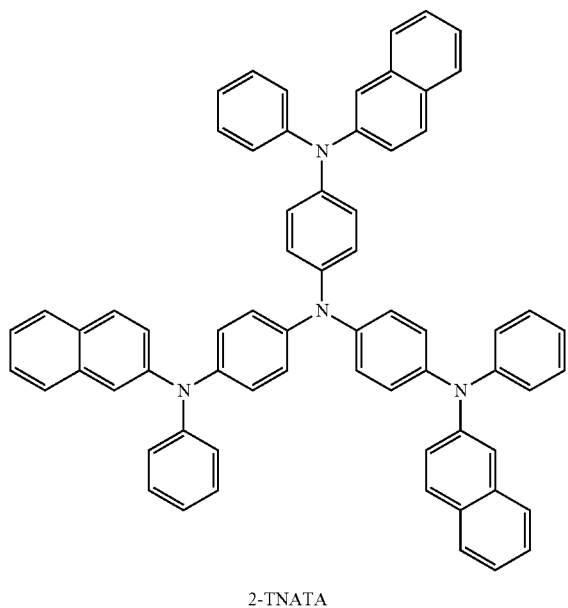

2-TNATA

The thickness of the HIL may be from about 100 Å to about 10,000 Å, for example, from about 100 Å to about 1,000 Å. In one embodiment, when the thickness of the HIL satisfies the above-described range, sufficient hole injection properties are obtained without a substantial increase of a driving voltage.

The HTL may be formed on the HIL by using various suitable methods such as a vacuum deposition method, a spin coating method, a cast method, an LB method, or the like. When the vacuum deposition method or the spin coating method is used to form the HTL, the deposition conditions and the coating conditions may be changed according to the compounds used, however, they may be selected from similar conditions for forming an HIL.

Suitable hole transport materials may include, for example, carbazole derivatives (such as N-phenyl carbazole or polyvinyl carbazole), N,N'-bis(3-methylphenyl)-N,N'-diphenyl-[1,1-biphenyl]-4,4'-diamine (TPD), 4,4',4"-tris(N-carbazolyl) triphenylamine) (TCTA), or N,N'-di(1-naphthyl)-N,N'-diphenylbenzidine (NPB), but the present invention is not thereby limited.

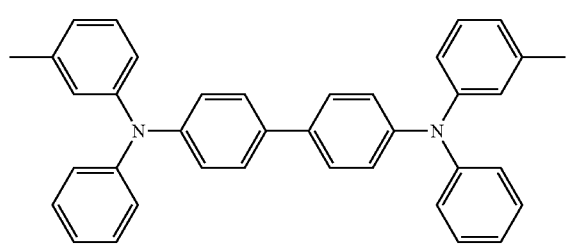

TPD

The thickness of the HTL may be from about 50 Å to about 2,000 Å, for example from about 100 Å to about 1,500 Å. In one embodiment, when the thickness of the HIL satisfies the above-described range, sufficient hole injection properties are obtained without a substantial increase of a driving voltage.

The HIL and the HTL are separately formed in FIG. 1. However, a hole injection transport layer having a hole transport function and a hole injection function at the same time may be formed. In this case, the hole injection transport layer may include both a suitable HIL material and a suitable HTL material. A thickness of the hole injection transport layer may be from about 500 Å to about 10,000 Å, for example, from about 100 Å to about 1,000 Å. In one embodiment, when the thickness of the HIL satisfies the above-described range, sufficient hole injection and transport properties are obtained without a substantial increase of a driving voltage.

The EML may be formed on the HTL by using a vacuum deposition method, a spin coating method, a cast method, an LB method, or the like. When the EML is formed by the vacuum deposition method or the spin coating method, the deposition conditions may be changed according to the compounds used, however they may be selected from similar conditions for forming an HIL.

Light may be emitted through the recombination of the electrons and the holes in the EML. A low molecular weight material or a high molecular weight material that may be liquefied may be used as the light emitting materials. According to the light emitting principles, a fluorescence material or a phosphorescence material may also be used as light emitting materials.

The EML may be formed by using a high molecular weight material including poly(p-phenylenevinylene) (PPV), poly (p-phenylene) (PPP), polythiophene (PT), polyfluorene (PF), poly(9,9-dioctylfluorene) (PFO), poly(9-vinylcarbazole) (PVK), or derivatives thereof, or by using a low molecular weight material including a metal complex such as an Al complex including Alq3 (tris(8-hydroxyquinolinato)aluminum), an Ir complex including Ir(ppy)3(fac-tris(2-phenylpyridinato) iridium (III)), or a Pt complex including 2,3,7,8,12, 13,17,18-octaethyl-12H,23H-porphyrine platinum (II) (PtOEP). In addition, a material obtained by adding a low molecular weight phosphorescence material into the high molecular weight material of poly(9-vinylcarbazole) (PVK) may be used to form the EML.

When the OLED is a full color OLED, the EML may be patterned into a red EML, a green EML, and a blue EML. Alternatively, the EML may be obtained by stacking two or more layers of the red EML, the green EML, and the blue EML, and may emit white light.

A thickness of the EML may be from about 100 Å to about 1,000 Å, for example from about 200 Å to about 600 Å. In one embodiment, when the thickness of the EML satisfies the above-described range, sufficient light-emitting properties are obtained without a substantial increase of a driving voltage.

The ETL may be formed on the EML by using various suitable methods such as a vacuum deposition method, a spin coating method, a cast method, or the like. When the ETL is formed by the vacuum deposition method or the spin coating method, the deposition conditions or the coating conditions may be changed according to the compounds used, however they may be selected from similar conditions for forming an HIL. Suitable ETL materials for stably transporting injected electrons from the second electrode may be used as the ETL materials.

Quinoline derivatives, particularly tris(8-quinolinolate) aluminum (Alq3), TAZ, Balq, beryllium bis(benzoquinoline-10-olate) (Bebq$_2$), compound 201, compound 202, TmPyPB, or the like may be used as the electron transport materials, but the present invention is not thereby limited.

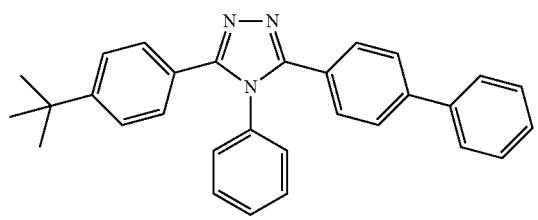

TAZ

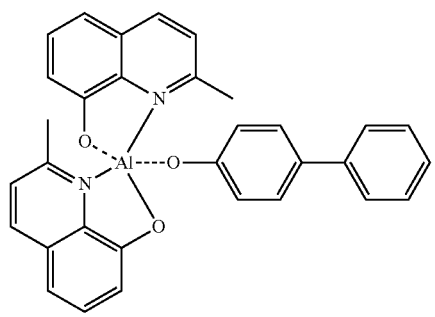

BAlq

Compound 201

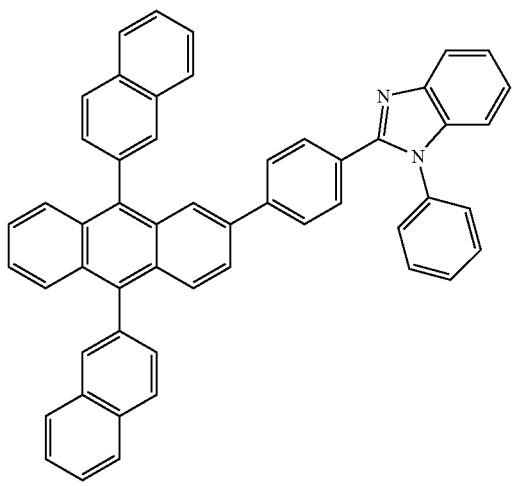

Compound 202

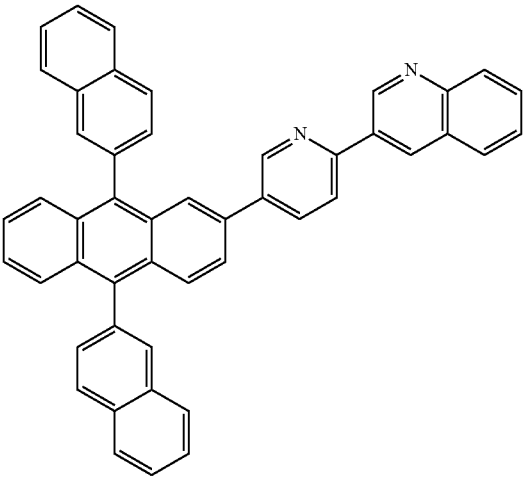

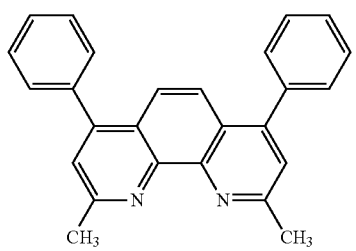

BCP

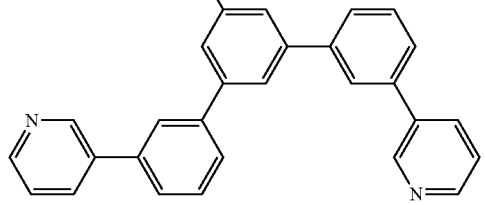

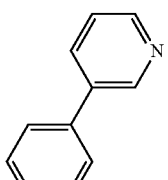

TmPyPB

A thickness of the ETL may be from about 100 Å to about 1,000 Å, for example from about 150 Å to about 500 Å. In one embodiment, when the thickness of the ETL satisfies the above-described range, sufficient electron transport properties are obtained without a substantial increase of a driving voltage.

The ETL may further include a metal-containing material other than the suitable electron transport organic compounds.

The metal-containing compound may include Li complex. Non-limiting examples of the Li-complex include lithium quinolate (LiQ) or the following compound 203.

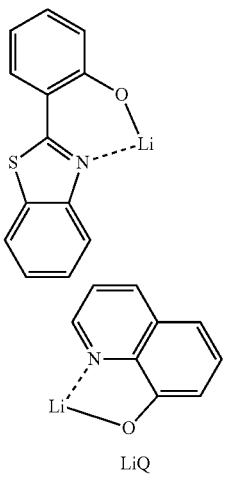

Compound 203

LiQ

The EIL including a material for easy injection of electrons from the second electrode may be stacked on the ETL.

Suitable EIL forming materials include LiF, NaCl, CsF, Li$_2$O, BaO, or the like. However, when the EIL is formed as a uniform single layer by using the above-mentioned materials, energy barriers for injecting electrons from the second electrode making a direct contact with the EIL into the EIL, and energy barriers for injecting electrons from the EIL to the ETL are large, and electron injection efficiency is not high.

To further increase the light-emitting efficiency of the OLED, the EIL is formed by using at least one of a metal compound and a semiconductor compound, the at least one of the metal compound and the semiconductor compound including at least one of an oxygen atom (O) and a sulfur atom (S) according to an example embodiment of the present invention. For example, the metal compound or the semiconductor compound may include elements found in group three and five in the periodic table. Besides, the metal compound or the semiconductor compound may also include metal materials such as zinc (Zn) or indium (In). The EIL may have an increasing oxygen concentration toward the second electrode, or an increasing sulfur concentration toward the ETL. In one embodiment, the concentration of the oxygen atom in the EIL may gradually increase toward the second electrode, and the concentration of the sulfur atom in the EIL may gradually increase as toward the ETL.

According to an example embodiment of the present invention, the EIL may be formed by using ZnS$_x$O$_{(1-x)}$ (x is a real number satisfying the condition 0<x<1). The concentration of the oxygen atom in the upper region of the EIL may gradually increase toward the second electrode from a point along the thickness direction of the EIL, and x may gradually decrease from 0.5 toward the second electrode. The concentration of the sulfur atom in the lower region of the EIL may gradually increase toward the ETL, and x may gradually increase from 0.5 toward the ETL.

Figure 2:
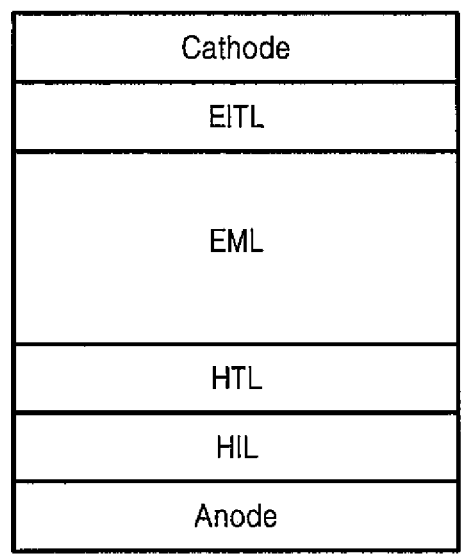
FIG. 2 is a schematic diagram illustrating an organic light-emitting diode according to another example embodiment of the present invention.

FIG. 2 is a schematic diagram illustrating an OLED according to another example embodiment of the present invention. With regard to FIG. 1, the EIL and the ETL are formed separately. However, an electron injection transport layer (EITL) having both the electron transport function and the electron injection function may be formed in the OLED of FIG. 2. In this case, the EITL may include both the suitable EIL material and the suitable ETL material. In FIG. 1, since the EIL material includes the at least one of the metal compound and the semiconductor compound, the at least one of the metal compound and the semiconductor compound including the at least one of the oxygen atom and the sulfur atom, the EITL in FIG. 2 also includes the same material(s). With respect to the EITL in FIG. 2, the EITL may have an increasing oxygen concentration toward the second electrode, and an increasing sulfur concentration toward the emission layer, for example, the concentration of the oxygen atom may gradually increase toward the second electrode, and the concentration of the sulfur atom may gradually increase toward the EML, the same as for the EIL.

Since the EIL is formed by using the above-described materials and has a concentration gradient, an energy level may have a gradient. Thus, an electron injection barrier between the ETL and the EIL and between the EIL and the second electrode may be reduced or minimized. When the EIL is formed by using ZnS$_x$O$_{(1-x)}$ (x is a real number satisfying the condition 0<x<1), and x decreases (e.g., gradually) from 0.5 toward the second electrode, the electron affinity of the EIL portion closer to the second electrode may be about 3.7 eV, and an energy barrier with an aluminum second electrode having a work function of about 4.2 eV may be reduced or minimized. The concentration of the sulfur atom in the lower region of the EIL closer to the ETL may decrease (e.g., gradually), and x may increase (e.g., gradually) from 0.5 toward the ETL. Thus, the electron affinity at the EIL portion closer to the ETL may be about 2.8 eV. As described above, the light-emitting efficiency of the OLED may be improved by reducing or minimizing the electron injection barrier at the EIL and improving the electron injection and balance.

An example embodiment of forming the EIL is as follows. First, a preliminary layer including the at least one of the metal compound and the semiconductor compound (the at least one of the metal compound and the semiconductor compound including the at least one of the oxygen atom and the sulfur atom) is formed on the ETL. The preliminary layer may be formed by a chemical mechanical vapor (CVD) method or an atomic layer deposition (ALD) method. The preliminary layer has no concentration gradient of the oxygen atom or the sulfur atom. For example, the preliminary layer may be formed by using ZnS$_x$O$_{(1-x)}$ (x is a real number satisfying the condition 0<x<1).

Then, the upper surface of the preliminary layer facing the second electrode is treated with ultraviolet-ozone (UV-O$_3$). In this case, the ozone receives a high energy via ultraviolet rays and is decomposed into an oxygen molecule and an oxygen atom. The oxygen vacancy of ZnS$_x$O$_{(1-x)}$ (x is a real number satisfying the condition 0<x<1) may be filled up with the separated oxygen atom. Thus, the upper surface of the EIL may be changed (e.g., gradually) into ZnO, and a ZnS portion may be increased (e.g., gradually) from the upper surface (facing the second electrode) toward the bottom surface of the EIL (facing the ETL) to exhibit a concentration gradient.

Figure 3:
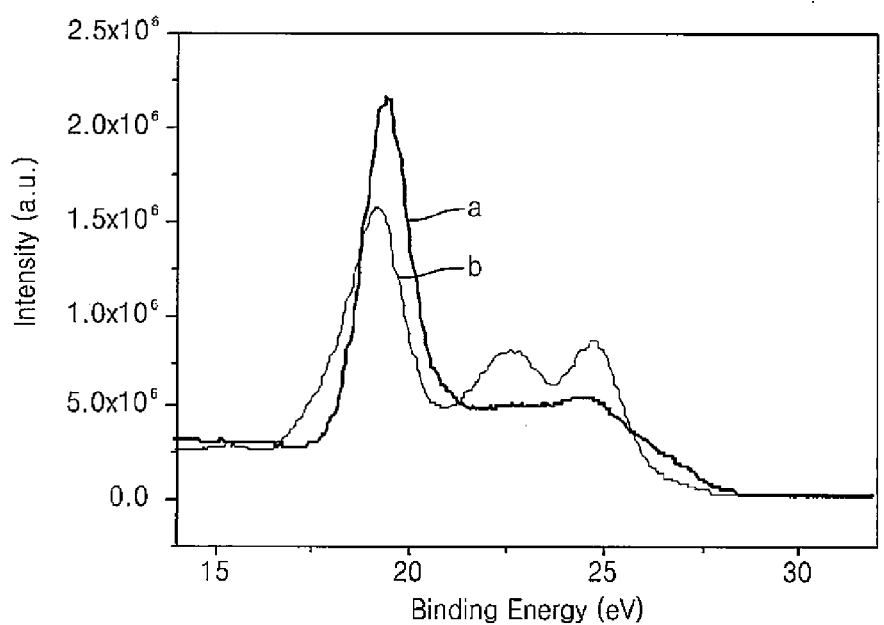
FIG. 3 illustrates a valence band of an electron injection layer when the surface thereof is treated (b) or untreated (a) with ultraviolet-ozone.

FIG. 3 illustrates a valence band of an EIL when the surface thereof is treated (b) or untreated (a) with ultraviolet-ozone. When the preliminary layer formed by using ZnS$_x$O$_{(1-x)}$ (x is a real number satisfying the condition 0<x<1) is treated with ultraviolet-ozone (i.e., for (b)), the intensity of the valence band in the corresponding binding energy band may be decreased to be similar to that of ZnO. In addition, it is also confirmed that the band edge increases.

Figure 4:
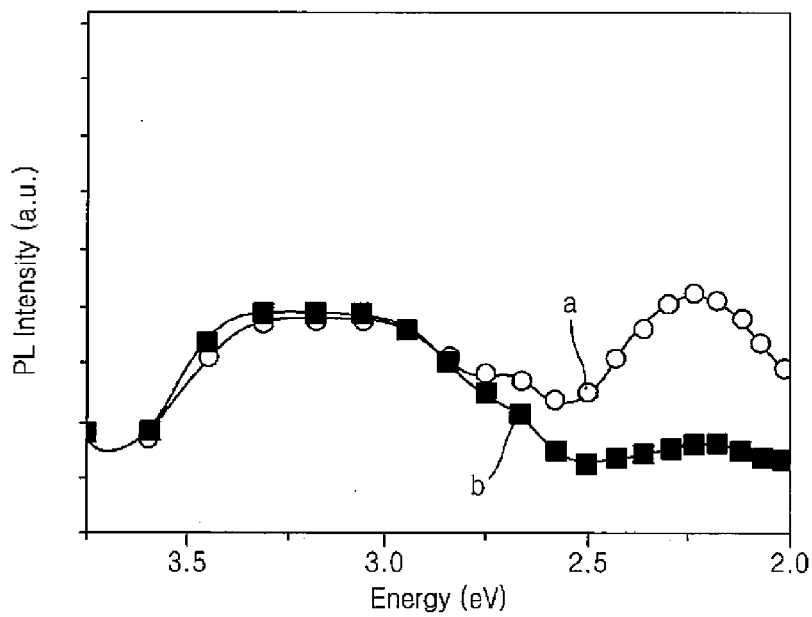
FIG. 4 illustrates a photoluminescence spectrum of an electron injection layer when the surface thereof is treated (b) or untreated (a) with ultraviolet-ozone.

FIG. 4 illustrates a photoluminescence spectrum of an EIL when the surface thereof is treated (b) or untreated (a) with ultraviolet-ozone. When the preliminary layer including ZnS$_x$O$_{(1-x)}$ (x is a real number satisfying the condition 0<x<1) is treated with ultraviolet-ozone (i.e. for (b)), an oxygen vacancy may be filled up with an oxygen atom, and the $ZnS_xO_{(1-x)}$ trap may be eliminated. Thus, it is confirmed that a peak at about 2.25 eV corresponding to a deep trap disappears.

Figure 5:
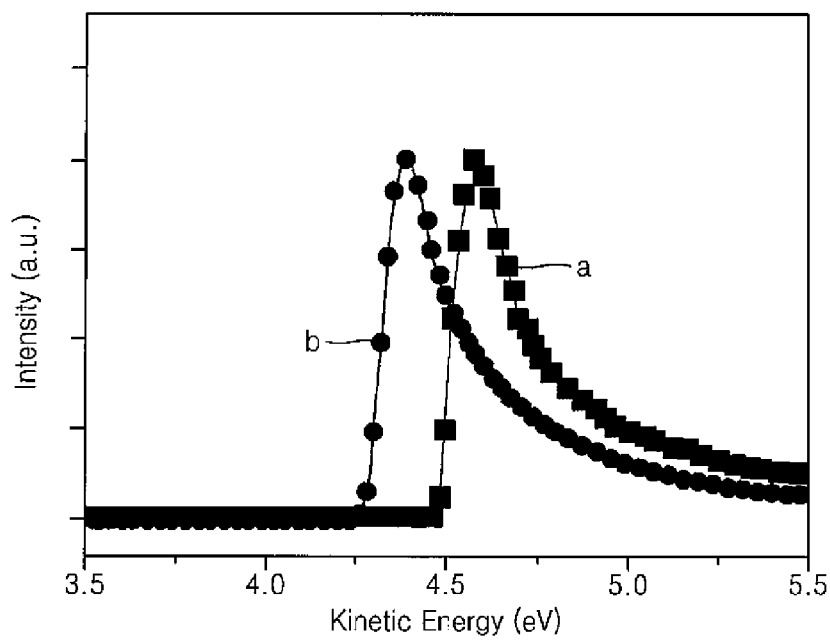
FIG. 5 illustrates a shift mode of a secondary electron cut-off of an electron injection layer when the surface thereof is treated (b) or untreated (a) with ultraviolet-ozone.
Figure 6:
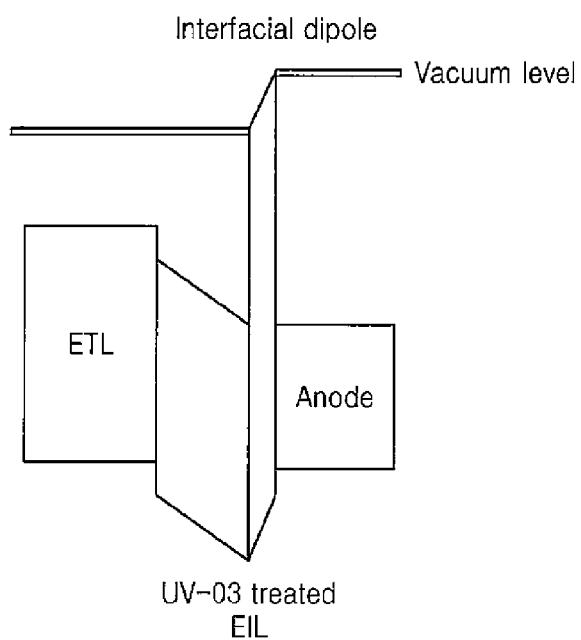
FIG. 6 illustrates a vacuum level change of an electron injection layer when the surface thereof is treated with ultraviolet-ozone.

FIG. 5 illustrates a shift mode of the secondary electron cut-off of an EIL when the surface thereof is treated (b) or untreated (a) with ultraviolet-ozone. FIG. 6 illustrates a vacuum level change of an EIL. The vacuum level of the treated portion of the preliminary layer including $ZnS_xO_{(1-x)}$ (x is a real number satisfying the condition 0<x<1) that is treated with ultraviolet-ozone may be changed to be similar to that of ZnO. Thus, a vacuum level concerning the electron affinity may be shifted upward due to the interfacial dipole of an oxide included in ZnO as illustrated in FIG. 6, and the shift mode may be confirmed from the shift of the secondary electron cut-off in FIG. 5. For the second electrode including aluminum and having a work function of about 4.2 eV, it may be confirmed that an interface of the ultraviolet-ozone treated EIL, and the second electrode makes an ohmic contact.

Based on the results of FIGS. 3 to 6, the upper surface of the EIL may be changed to include a material having an electron affinity similar to the work function of the second electrode, and an energy barrier between the second electrode and the EIL may be reduced or minimized.

According to another example embodiment of forming the EIL of the inventive concept, the concentration gradient of the oxygen atom and the sulfur atom may be obtained while forming the EIL on the ETL. That is, an EIL including the at least one of the metal compound and the semiconductor compound having a concentration gradient of the oxygen atom and the sulfur atom may be formed by time-controlling the concentration of the oxygen atom and the sulfur atom (e.g., vary the concentration of the oxygen atom and the sulfur atom in the source material with time) while forming the EIL by a CVD method or the ALD method.

Particularly, a method of forming $ZnS_xO_{(1-x)}$ (x is a real number satisfying the condition 0<x<1) having a concentration gradient of an oxygen atom and a sulfur atom by using the ALD method is as follows. According to the ALD method, diethyl zinc, hydrogen sulfide ($H_2S$), and water ($H_2O$) may be injected one by one. Then, zinc (Zn), oxygen (O) and sulfur (S) may be grown through self-assembling to form a layer composed of $ZnS_xO_{(1-x)}$ (x is a real number satisfying the condition 0<x<1). When controlling the ratio of hydrogen sulfide ($H_2S$) and water ($H_2O$), a sulfur atom-rich condition may be provided at the initial growth stage of the EIL, and an oxygen-rich condition may be provided at the latter growth stage of the EIL, to form $ZnS_xO_{(1-x)}$ (x is a real number satisfying the condition 0<x<1) having a concentration gradient of the oxygen atom and the sulfur atom. The ALD method is conducted at from about 100° C. to about 120° C., which is lower than the transforming (decomposition) temperature of an organic material, that is, about 300° C. Thus, deterioration of the EML including the organic material may not be generated.

Even when the EIL including $ZnS_xO_{(1-x)}$ (x is a real number satisfying the condition 0<x<1) having the concentration gradient of the oxygen atom and the sulfur atom is formed by the ALD method, the upper surface of the EIL facing the second electrode may be additionally treated with ultraviolet-ozone.

Figure 7:
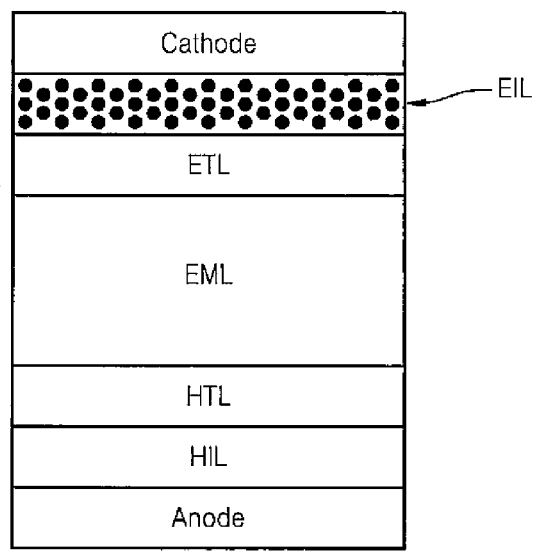
FIG. 7 is a schematic diagram of an organic light-emitting diode according to another example embodiment of the present invention.

FIG. 7 is a schematic diagram of an OLED according to another example embodiment of the present invention. Different from FIG. 1, the EIL in FIG. 7 includes nano particles. Particularly, the EIL includes nano particles of the at least one of the metal compound and the semiconductor compound, the at least one of the metal compound and the semiconductor compound including the oxygen atom or the sulfur atom. The concentration of the nano particles including the oxygen atom in the EIL may increase (e.g., gradually) toward the second electrode, and the concentration of the nano particles including the sulfur atom in the EIL may increase (e.g., gradually) toward the ETL.

The EIL in FIG. 7 may be formed by using a solution coating method. The nano particles of the metal compound or the semiconductor compound including the oxygen atom and the nano particles of the metal compound or the semiconductor compound including the sulfur atom are coated on the ETL via the solution coating method. The solution coating method may be a spin coating method, an inkjet printing method, a slit coating method, a spray coating method, or the like.

First, the nano particles of the metal compound or the semiconductor compound including the sulfur atom are coated on the ETL by the solution coating method. Then, the nano particles of the metal compound or the semiconductor compound including the oxygen atom and the nano particles of the metal compound or the semiconductor compound including the sulfur atom are mixed and coated on the ETL. After that, the nano particles of the metal compound or the semiconductor compound including the oxygen atom are coated on the ETL by the solution coating method. Thus, the EIL having the concentration gradient of the oxygen atom and the sulfur atom may be formed by controlling the thickness of the mixture layer of the nano particles or the mixing ratio of the nano particles.

Figure 8:
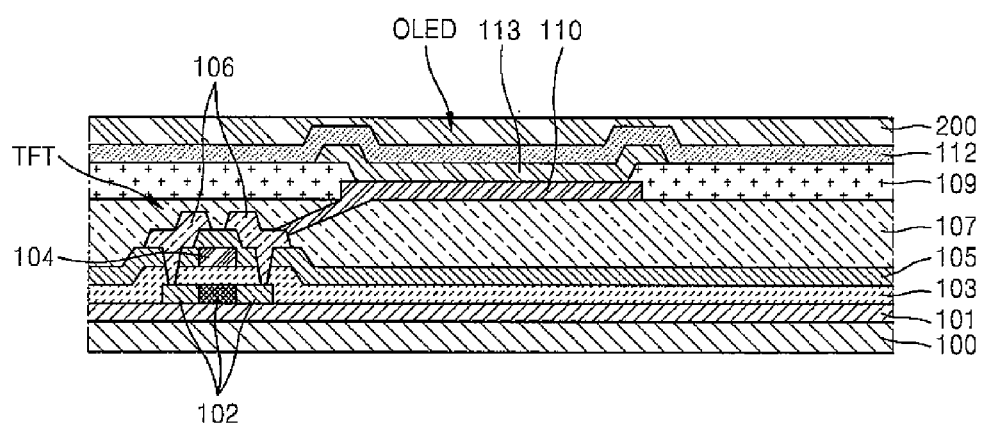
FIG. 8 is a schematic diagram of an organic light-emitting display apparatus according to an example embodiment of the present invention.

FIG. 8 is a schematic diagram of an organic light-emitting display apparatus according to an example embodiment of the present invention.

To manufacture the organic light-emitting display apparatus of FIG. 8, a buffer layer 101 is formed on a substrate 100 formed of a glass, a plastic, or the like, and a thin film transistor (TFT) array is formed on the buffer layer 101. The thin film transistor array is obtained by arranging a plurality of thin film transistors, and each of the thin film transistors may include an active layer 102, a gate electrode 104, and source/drain electrodes 106. A gate insulating layer 103 is provided between the active layer 102 and the gate electrode 104 for insulation. An interlayer insulating layer 105 is provided for insulation between the source/drain electrodes 106 and the gate electrode 104. A passivation layer 107 covering the thin film transistor array is provided, and the OLED in FIG. 1, 2 or 7 is provided on the passivation layer 107. Particularly, a first electrode 110 is provided on the passivation layer 107, and a pixel defining layer 109 covering the edge portion of the first electrode 110 and defining a light-emitting region is provided on the passivation layer 107. An intermediate layer 113 is provided on the first electrode 110 exposed by an opening portion of the pixel defining layer 109. The intermediate layer 113 may include an EIL or an EITL according to an example embodiment of the inventive concept other than the EML. Then, a second electrode 112 is formed to cover the intermediate layer 113. Finally, an encapsulating layer 200 is formed to encapsulate the obtained OLED in order to protect it from external agents.

In the organic light-emitting display apparatus including the OLED according to an example embodiment of the present invention, electron injection may be improved and an operating voltage may be decreased to increase the power efficiency of the organic light-emitting display apparatus. Thus, the power consumption of the organic light-emitting display apparatus may be decreased.

It should be understood that the example embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the attached figures, it will be understood by those of ordinary skill in the art that various changes in form and details may be made therein without departing from the spirit and scope of the present invention as defined by the following claims, and equivalents thereof.

What is claimed is:

1. An organic light-emitting diode comprising:
a first electrode;
an intermediate layer on the first electrode; and
a second electrode on the intermediate layer,
the intermediate layer comprising:
an emission layer comprising an organic material; and
a functional layer between the second electrode and the emission layer and comprising at least one of a metal compound and a semiconductor compound, the at least one of the metal compound and the semiconductor compound comprising at least one of an oxygen atom and a sulfur atom, the functional layer having an increasing oxygen concentration toward the second electrode, or an increasing sulfur concentration toward the emission layer.

2. The organic light-emitting diode of claim 1, wherein the functional layer is an electron injection layer or an electron injection transport layer.

3. The organic light-emitting diode of claim 1, wherein the functional layer comprises $ZnS_xO_{(1-x)}$ (x is a real number satisfying the condition $0<x<1$), x decreasing from 0.5 toward the second electrode and increasing from 0.5 toward the emission layer.

4. The organic light-emitting diode of claim 1, wherein the functional layer comprises nano particles of the at least one of the metal compound and the semiconductor compound, a concentration of the nano particles including the oxygen atom increasing toward the second electrode, or a concentration of the nano particles including the sulfur atom increasing toward the emission layer.

5. The organic light-emitting diode of claim 1, wherein:
the at least one of the metal compound and the semiconductor compound comprising both the oxygen atom and the sulfur atom, the functional layer having both the increasing oxygen concentration toward the second electrode, and the increasing sulfur concentration toward the emission layer.

6. The organic light-emitting diode of claim 5, wherein:
the functional layer has a concentration gradient with more oxygen concentration toward the second electrode and less oxygen concentration toward the emission layer; and
a concentration gradient with more sulfur concentration toward the emission layer and less sulfur concentration toward the second electrode.

7. The organic light-emitting diode of claim 1, wherein:
the functional layer has a concentration gradient with more oxygen concentration toward the second electrode and less oxygen concentration toward the emission layer; or
a concentration gradient with more sulfur concentration toward the emission layer and less sulfur concentration toward the second electrode.

8. An organic light-emitting display apparatus comprising:
a substrate;
a thin film transistor array on the substrate;
an insulating layer covering the thin film transistor array;
an organic light-emitting diode on the insulating layer and comprising a first electrode, an intermediate layer on the first electrode, and a second electrode on the intermediate layer; and
an encapsulating layer on the substrate for encapsulating the organic light-emitting diode,
the intermediate layer comprising:
an emission layer comprising an organic material; and
a functional layer between the second electrode and the emission layer and comprising at least one of a metal compound and a semiconductor compound, the at least one of the metal compound and the semiconductor compound comprising at least one of an oxygen atom and a sulfur atom, the functional layer having an increasing oxygen concentration toward the second electrode, or an increasing sulfur concentration toward the emission layer.

9. The organic light-emitting display apparatus of claim 8, wherein:
the functional layer is an electron injection layer or an electron injection transport layer.

10. The organic light-emitting display apparatus of claim 8, wherein:
the functional layer includes $ZnS_xO_{(1-x)}$ (x is a real number satisfying the condition $0<x<1$), x decreasing from 0.5 toward the second electrode, and x increasing from 0 toward the emission layer.

11. The organic light-emitting display apparatus of claim 8, wherein:
the functional layer comprises nano particles of the at least one of the metal compound and the semiconductor compound, a concentration of the nano particles comprising the oxygen atom increasing toward the second electrode, or a concentration of the nano particles comprising the sulfur atom increasing toward the emission layer.

12. The organic light-emitting display apparatus of claim 8, wherein:
the at least one of the metal compound and the semiconductor compound comprising both the oxygen atom and the sulfur atom, the functional layer having both the increasing oxygen concentration toward the second electrode, and the increasing sulfur concentration toward the emission layer.

13. A method of manufacturing an organic light-emitting diode, the method comprising:
forming a first electrode;
forming an intermediate layer on the first electrode; and
forming a second electrode on the intermediate layer,
the forming of the intermediate layer comprising:
forming an emission layer comprising an organic material; and
forming a functional layer between the second electrode and the emission layer, the functional layer comprising at least one of a metal compound and a semiconductor compound, the at least one of the metal compound and the semiconductor compound comprising at least one of an oxygen atom and a sulfur atom, the functional layer having an increasing oxygen concentration toward the second electrode, or an increasing sulfur concentration toward the emission layer.

14. The method of manufacturing an organic light-emitting diode of claim 13, wherein: the forming of the functional layer comprises:
forming a preliminary layer comprising the at least one of the metal compound and the semiconductor compound on the emission layer via a chemical vapor deposition method or an atomic layer deposition method; and treating a surface of the preliminary layer facing the second electrode with ultraviolet-ozone.

15. The method of manufacturing an organic light-emitting diode of claim 13, wherein: in the forming of the functional layer a concentration of the oxygen atom or a concentration of the sulfur atom in the metal compound or the semiconductor compound is time-controlled via a chemical vapor deposition method or an atomic layer deposition method.

16. The method of manufacturing an organic light-emitting diode of claim 15, further comprising:
   treating a surface of the functional layer facing the second electrode with ultraviolet-ozone.

17. The method of manufacturing an organic light-emitting diode of claim 13, wherein: the functional layer comprises nano particles of the at least one of the metal compound and the semiconductor compound,
   the functional layer being formed by a solution coating method, a concentration of the nano particles including the oxygen atom in the functional layer increasing toward the second electrode, or a concentration of the nano particles including the sulfur atom in the functional layer increasing toward the emission layer.

18. The method of manufacturing an organic light-emitting diode of claim 13, wherein:
   the at least one of the metal compound and the semiconductor compound comprising both the oxygen atom and the sulfur atom, the functional layer having both the increasing oxygen concentration toward the second electrode, and the increasing sulfur concentration toward the emission layer.

* * * * *